(12) United States Patent
Lin et al.

(10) Patent No.: US 10,319,879 B2
(45) Date of Patent: Jun. 11, 2019

(54) SEMICONDUCTOR STRUCTURE

(71) Applicant: Genesis Photonics Inc., Tainan (TW)

(72) Inventors: Cheng-Hung Lin, Tainan (TW); Jeng-Jie Huang, Tainan (TW); Chi-Feng Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 15/453,873

(22) Filed: Mar. 8, 2017

(65) Prior Publication Data
US 2017/0263814 A1 Sep. 14, 2017

(30) Foreign Application Priority Data

Mar. 8, 2016 (TW) .............................. 105106975 A

(51) Int. Cl.
*H01L 33/14* (2010.01)
*H01L 33/06* (2010.01)
(Continued)

(52) U.S. Cl.
CPC .............. *H01L 33/14* (2013.01); *H01L 33/32* (2013.01); *H01L 33/02* (2013.01); *H01L 33/325* (2013.01)

(58) Field of Classification Search
CPC ....... H01L 33/32; H01L 33/14; H01L 33/325; H01L 33/02; H01L 33/06
See application file for complete search history.

(56) References Cited

U.S. PATENT DOCUMENTS 6,319,742 B1 11/2001 Hayashi et al.
8,304,793 B2 11/2012 Yoshizumi et al.
(Continued)

FOREIGN PATENT DOCUMENTS

CN 1409875 4/2003
CN 1440578 9/2003
(Continued)

OTHER PUBLICATIONS

"Office Action of China Related Application No. 201710029565.6", dated Jul. 20, 2018, pp. 1-8.
(Continued)

*Primary Examiner* — Caridad Everhart
(74) *Attorney, Agent, or Firm* — JCIPRNET

(57) ABSTRACT

A semiconductor structure includes a first-type semiconductor layer, a second-type semiconductor layer, a light emitting layer and a hole supply layer. The light emitting layer is disposed between the first-type semiconductor layer and the second-type semiconductor layer. The hole supply layer is disposed between the light emitting layer and the second-type semiconductor layer, and the hole supply layer includes a first hole supply layer and a second hole supply layer. The first hole supply layer is disposed between the light emitting layer and the second hole supply layer, and a chemical formula of the first hole supply layer is $Al_{x1}In_{y1}Ga_{1-x1-y1}N$, wherein $0 \leq x1 < 0.4$, and $0 \leq y1 < 0.4$. The second hole supply layer is disposed between the first hole supply layer and the second-type semiconductor layer, a chemical formula of the second hole supply layer is $Al_{x2}In_{y2}Ga_{1-x2-y2}N$, wherein $0 \leq x2 < 0.4$, $0 \leq y2 < 0.4$, and $x1 > x2$.

17 Claims, 13 Drawing Sheets

(51) Int. Cl.
*H01L 33/32* (2010.01)
*H01L 33/02* (2010.01)

(56) References Cited

U.S. PATENT DOCUMENTS

| | | | |
|---|---|---|---|
| 2002/0014632 A1* | 2/2002 | Kaneyama | B82Y 20/00 257/103 |
| 2003/0006418 A1 | 1/2003 | Emerson et al. | |
| 2003/0085409 A1 | 5/2003 | Shen et al. | |
| 2003/0189218 A1* | 10/2003 | Watanabe | B82Y 20/00 257/103 |
| 2004/0264533 A1 | 12/2004 | Matsumura et al. | |
| 2005/0167693 A1* | 8/2005 | Goetz | H01L 33/32 257/103 |
| 2005/0179027 A1 | 8/2005 | Kim et al. | |
| 2005/0224781 A1 | 10/2005 | Kneissl et al. | |
| 2005/0224835 A1 | 10/2005 | Nomura et al. | |
| 2006/0118820 A1 | 6/2006 | Gaska et al. | |
| 2007/0045638 A1* | 3/2007 | Shen | H01L 33/32 257/94 |
| 2007/0096077 A1 | 5/2007 | Sanga et al. | |
| 2007/0181869 A1* | 8/2007 | Gaska | B82Y 20/00 257/14 |
| 2008/0116476 A1* | 5/2008 | Komada | B82Y 20/00 257/103 |
| 2008/0315243 A1* | 12/2008 | Ueno | H01L 33/32 257/101 |
| 2009/0008648 A1* | 1/2009 | Biwa | H01L 33/025 257/76 |
| 2009/0008659 A1* | 1/2009 | Ohno | B82Y 20/00 257/96 |
| 2009/0026489 A1 | 1/2009 | Kuramoto | |
| 2009/0057696 A1 | 3/2009 | Kuo et al. | |
| 2009/0224226 A1* | 9/2009 | Huang | H01L 33/06 257/13 |
| 2010/0008393 A1* | 1/2010 | Enya | H01L 33/06 372/46.01 |
| 2010/0025652 A1* | 2/2010 | Stauss | B82Y 20/00 257/13 |
| 2010/0133506 A1* | 6/2010 | Nakanishi | B82Y 20/00 257/13 |
| 2011/0001126 A1 | 1/2011 | Kamikawa et al. | |
| 2011/0114916 A1* | 5/2011 | Yoshizumi | B82Y 20/00 257/13 |
| 2011/0187294 A1* | 8/2011 | Bergmann | H01L 33/04 315/363 |
| 2011/0233558 A1* | 9/2011 | Lee | H01L 33/04 257/76 |
| 2012/0069863 A1* | 3/2012 | Sizov | B82Y 20/00 372/45.012 |
| 2012/0319080 A1* | 12/2012 | Fudeta | H01L 33/12 257/13 |
| 2013/0001509 A1* | 1/2013 | Fudeta | H01L 33/04 257/13 |
| 2013/0161586 A1 | 6/2013 | Okuno et al. | |
| 2013/0277642 A1* | 10/2013 | Kneissl | H01L 33/06 257/13 |
| 2015/0179881 A1* | 6/2015 | Senes | H01L 33/06 257/94 |
| 2015/0263228 A1* | 9/2015 | Lee | H01L 33/04 257/76 |
| 2016/0118531 A1* | 4/2016 | Jain | H01L 33/04 257/94 |
| 2016/0322533 A1* | 11/2016 | Chang | H01L 33/06 |
| 2017/0117438 A1* | 4/2017 | Shur | H01L 33/06 |

FOREIGN PATENT DOCUMENTS

| | | |
|---|---|---|
| CN | 101073160 | 11/2007 |
| CN | 101188264 | 5/2008 |
| CN | 101330123 | 12/2008 |
| CN | 101339970 | 1/2009 |
| CN | 101461069 | 6/2009 |
| CN | 101494265 | 7/2009 |
| CN | 101527341 | 9/2009 |
| CN | 101540364 | 9/2009 |
| CN | 101626058 | 1/2010 |
| CN | 101645480 | 2/2010 |
| CN | 101684549 | 3/2010 |
| CN | 101689586 | 3/2010 |
| CN | 101740691 | 6/2010 |
| CN | 101944480 | 1/2011 |
| CN | 102005513 | 4/2011 |
| CN | 102130425 | 7/2011 |
| CN | 102157646 | 8/2011 |
| CN | 102185056 | 9/2011 |
| CN | 102201514 | 9/2011 |
| CN | 102208505 | 10/2011 |
| CN | 102214753 | 10/2011 |
| CN | 102474076 | 5/2012 |
| CN | 102856449 | 1/2013 |
| CN | 102859723 | 1/2013 |
| CN | 102881784 | 1/2013 |
| CN | 103137807 | 6/2013 |
| EP | 1221723 | 7/2002 |
| JP | H09321389 | 12/1997 |
| JP | H09326508 | 12/1997 |
| JP | H10135575 | 5/1998 |
| JP | 2000058904 | 2/2000 |
| JP | 2000196143 | 7/2000 |
| JP | 2001015437 | 1/2001 |
| JP | 2008034658 | 2/2008 |
| JP | 2009016452 | 1/2009 |
| JP | 2009152448 | 7/2009 |
| JP | 2010263140 | 11/2010 |
| JP | 2014103384 | 6/2014 |
| TW | 402735 | 8/2000 |
| TW | 451504 | 8/2001 |
| TW | 200908393 | 2/2009 |
| TW | 200915618 | 4/2009 |
| TW | 200939519 | 9/2009 |
| TW | 201011952 | 3/2010 |
| TW | 201208112 | 2/2012 |
| TW | 201308658 | 2/2013 |
| WO | 2007013257 | 2/2007 |

OTHER PUBLICATIONS

"Office Action of Taiwan Related Application No. 107115825", dated Jul. 26, 2018, pp. 1-3.
"Office Action of Japan Related Application No. 2015156949", dated Jun. 5, 2018, pp. 1-10.
"Office Action of U.S. Appl. No. 15/723,117", dated Jul. 12, 2018, pp. 1-24.
"Office Action of U.S. Appl. No. 15/981,864", dated Jul. 16, 2018, pp. 1-21.
"Notice of Allowance of U.S. Appl. No. 15/627,419", dated Jul. 20, 2018, pp. 1-25.
"Notice of Allowance of U.S. Appl. No. 15/627,417", dated Jul. 19, 2018, pp. 1-22.
"Office Action of China Related Application No. 201711125219.4", dated Dec. 21, 2018, pp. 1-6.
"Office Action of China Related Application No. 201810015565.5", dated Jan. 3, 2019, pp. 1-7.
"Office Action of Japan Related Application No. 2015156949", dated Nov. 27, 2018, pp. 1-9.
"Office Action of Taiwan Related Application No. 104123883", dated Nov. 2, 2018, pp. 1-4.
"Office Action of China Related Application No. 201710702885.3", dated Nov. 19, 2018, pp. 1-12.
"Office Action of China Related Application No. 201710702844.4", dated Oct. 12, 2018, pp. 1-6.
"Office Action of China Related Application No. 201711123066.X", dated Dec. 5, 2018, pp. 1-6.
"Office Action of Taiwan Related Application No. 104123678", dated Dec. 11, 2018, pp. 1-6.
"Office Action of China Related Application No. 201710702864.1", dated Nov. 20, 2018, pp. 1-13.

(56) References Cited

OTHER PUBLICATIONS

"Office Action of China Related Application No. 201810345115.2", dated Apr. 1, 2019, pp. 1-14.
"Office Action of China Related Application No. 201810345069.6", dated Mar. 29, 2019, pp. 1-14.
"Office Action of China Related Application No. 201810016160.3", dated Mar. 29, 2019, pp. 1-8.
"Office Action of China Related Application No. 201810450545.0", dated Mar. 6, 2019, pp. 1-12.
"Office Action of U.S. Appl. No. 15/708,162", dated Feb. 8, 2019, pp. 1-8.
"Office Action of Taiwan Related Application No. 107122851", dated Jan. 25, 2019, pp. 1-6.
"Office Action of China Related Application, application No. 201810450395.3", dated Apr. 12, 2019, p. 1-p. 6.
"Office Action of China Related Application, application No. 201810344250.5", dated Apr. 15, 2019, p. 1-p. 8.

\* cited by examiner

SEMICONDUCTOR STRUCTURE

CROSS-REFERENCE TO RELATED APPLICATION

This application claims the priority benefit of Taiwan application serial no. 105106975, filed on Mar. 8, 2016. The entirety of the above-mentioned patent application is hereby incorporated by reference herein and made a part of this specification.

BACKGROUND OF THE INVENTION

1. Field of the Invention

The present disclosure generally relates to a semiconductor structure, and more particularly, to a semiconductor structure having a hole supply layer.

2. Description of Related Art

In a conventional light-emitting diode chip, in order to increase the possibility for combining electrons and holes and to elevate the electron impedance, a quaternary aluminum indium gallium nitride ($Al_xIn_yGa_{1-x-y}N$) semiconductor layer having a high aluminum content is disposed between a light emitting layer and a P-type semiconductor layer, and this semiconductor layer may be doped with a high concentration of magnesium or carbon. However, although the aluminum indium gallium nitride having the high aluminum content can effectively enhance an electron impedance effect, it is accompanied by the issue of high driving voltage.

SUMMARY OF THE INVENTION

The disclosure provides a semiconductor structure having a hole supply layer, in which an electron impedance performance is increased by adjusting an aluminum content in the hole supply layer, thereby preventing a rise in driving voltage.

The semiconductor structure of the disclosure includes a first-type semiconductor layer, a second-type semiconductor layer, a light emitting layer and a hole supply layer. The light emitting layer is disposed between the first-type semiconductor layer and the second-type semiconductor layer. The hole supply layer is disposed between the light emitting layer and the second-type semiconductor layer, and the hole supply layer includes a first hole supply layer and a second hole supply layer. The first hole supply layer is disposed between the light emitting layer and the second hole supply layer, and a chemical formula of the first hole supply layer is $Al_{x1}In_{y1}Ga_{1-x1-y1}N$, wherein $0 \leq x1 < 0.4$ and $0 \leq y1 < 0.4$. The second hole supply layer is disposed between the first hole supply layer and the second-type semiconductor layer, and a chemical formula of the second hole supply layer is $Al_{x2}In_{y2}Ga_{1-x2-y2}N$, wherein $0 \leq x2 < 0.4$, $0 \leq y2 < 0.4$, and $x1 > x2$.

In one embodiment of the disclosure, the hole supply layer further includes a third hole supply layer disposed between the second hole supply layer and the second-type semiconductor layer, and a chemical formula of the third hole supply layer is $Al_{x3}In_{y3}Ga_{1-x3-y3}N$, wherein $0 \leq x3 < 0.4$, $0 \leq y3 < 0.4$, and $x3 > x2$.

In one embodiment of the disclosure, a thickness of the first hole supply layer is greater than or equal to 2 nm and smaller than or equal to 50 nm.

In one embodiment of the disclosure, a thickness of the second hole supply layer is greater than or equal to 2 nm and smaller than or equal to 50 nm.

In one embodiment of the disclosure, the first hole supply layer is doped with a first dopant in a concentration greater than or equal to $3 \times 10^{17}$ atom/$cm^3$, and the first dopant is carbon.

In one embodiment of the disclosure, the first hole supply layer is doped with a second dopant in a concentration greater than or equal to $10^{19}$ atom/$cm^3$, and the second dopant is magnesium.

In one embodiment of the disclosure, the second hole supply layer is doped with a first dopant in a concentration greater than or equal to $3 \times 10^{17}$ atom/$cm^3$, and the first dopant is carbon.

In one embodiment of the disclosure, the second hole supply layer is doped with a second dopant in a concentration greater than or equal to $10^{19}$ atom/$cm^3$, and the second dopant is magnesium.

In one embodiment of the disclosure, each of the value of x1 and the value of x2 in the chemical formulae of the first hole supply layer and the second hole supply layer is a fixed value.

In one embodiment of the disclosure, the value of x1 and the value of x2 in the chemical formulae of the first hole supply layer and the second hole supply layer respectively represent a gradient distribution along with a thickness of the first hole supply layer and a thickness of the second hole supply layer.

In one embodiment of the disclosure, the value of x1 and the value of x2 in the chemical formulae of the first hole supply layer and the second hole supply layer respectively represent a stepped distribution along with a thickness of the first hole supply layer and a thickness of the second hole supply layer.

In one embodiment of the disclosure, each of the first hole supply layer and the second hole supply layer is a superlattice hole supply layer.

In one embodiment of the disclosure, the first hole supply layer includes at least one first sub-hole supply layer and at least one second sub-hole supply layer. A chemical formula of the first sub-hole supply layer is $Al_{x1a}In_{y1a}Ga_{1-x1a-y1a}N$, wherein $0 \leq x1a < 0.4$ and $0 \leq y1a < 0.4$. A chemical formula of the second sub-hole supply layer is $Al_{x1b}In_{y1b}Ga_{1-x1b-y1b}N$, wherein $0 \leq x1b < 0.4$ and $0 \leq y1b < 0.4$. Each of a thickness of the first sub-hole supply layer and a thickness of the second sub-hole supply layer is greater than 1 nm and smaller than 30 nm.

In one embodiment of the disclosure, the second hole supply layer includes at least one third sub-hole supply layer and at least one fourth sub-hole supply layer. A chemical formula of the third sub-hole supply layer is $Al_{x2a}In_{y2a}Ga_{1-x2a-y2a}N$, wherein $0 \leq x2a < 0.4$ and $0 \leq y2a < 0.4$. A chemical formula of the fourth sub-hole supply layer is $Al_{x2b}In_{y2b}Ga_{1-x2b-y2b}N$, wherein $0 \leq x2b < 0.4$ and $0 \leq y2b < 0.4$. Each of a thickness of the third sub-hole supply layer and a thickness of the fourth sub-hole supply layer is greater than 1 nm and smaller than 30 nm.

The disclosure further provides a semiconductor structure, which includes a first-type semiconductor layer, a second-type semiconductor layer, a light emitting layer and a hole supply layer. The light emitting layer disposed between the first-type semiconductor layer and the second-type semiconductor layer. The hole supply layer is disposed between the light emitting layer and the second-type semiconductor layer, and a chemical formula of the hole supply layer is $Al_xIn_yGa_{1-x-y}N$, wherein $0 \leq x < 0.4$ and $0 \leq y < 0.4$, and in the chemical formula of the hole supply layer, the value of x at where is nearby the light emitting layer is greater than the value of x at where is nearby the P-type semiconductor layer.

The disclosure further provides a semiconductor structure, which includes a first-type semiconductor layer, a second-type semiconductor layer, a light emitting layer, a first aluminum indium gallium nitride layer and a second aluminum indium gallium nitride layer. The light emitting layer is disposed between the first-type semiconductor layer and the second-type semiconductor layer. The first aluminum indium gallium nitride layer is disposed between the light emitting layer and the second-type semiconductor layer. The second aluminum indium gallium nitride layer is disposed between the first aluminum indium gallium nitride and the second-type semiconductor layer, wherein an aluminum content in the first aluminum indium gallium nitride layer is greater than an aluminum content in the second aluminum indium gallium nitride layer.

In one embodiment of the disclosure, the semiconductor structure further includes a third aluminum indium gallium nitride layer disposed between the second aluminum indium gallium nitride layer and the second-type semiconductor layer wherein an aluminum content in the third aluminum indium gallium nitride layer is greater than aluminum content in the second aluminum indium gallium nitride layer.

In one embodiment of the disclosure, the first hole supply layer is doped with a first dopant in a concentration greater than or equal to $3 \times 10^{17}$ atom/cm$^3$, and the first dopant is carbon.

In one embodiment of the disclosure, the first hole supply layer is doped with a second dopant in a concentration greater than or equal to $10^{19}$ atom/cm$^3$, and the second dopant is magnesium.

In one embodiment of the disclosure, the second hole supply layer is doped with a first dopant in a concentration greater than or equal to $3 \times 10^{17}$ atom/cm$^3$, and the first dopant is carbon.

In one embodiment of the disclosure, the second hole supply layer is doped with a second dopant in a concentration greater than or equal to $10^{19}$ atom/cm$^3$, and the second dopant is magnesium.

In view of the above, since the semiconductor structure of the disclosure has the hole supply layer, more holes can be provided to enter the light emitting layer so that combinations of electron and hole can be increased. Furthermore, a material of the hole supply layer of the disclosure is aluminum indium gallium nitride ($Al_xIn_yGa_{1-x-y}N$), and by adjusting an aluminum content in the hole supply layer, in addition to effectively confining the electrons and the holes within the light emitting layer to effectively enhance an electron impedance performance, a rise in voltage can also be effectively prevented.

In order to make the aforementioned features and advantages of the present disclosure more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the disclosure and, together with the description, serve to explain the principles of the invention.

DESCRIPTION OF THE EMBODIMENTS

Figure 1A:
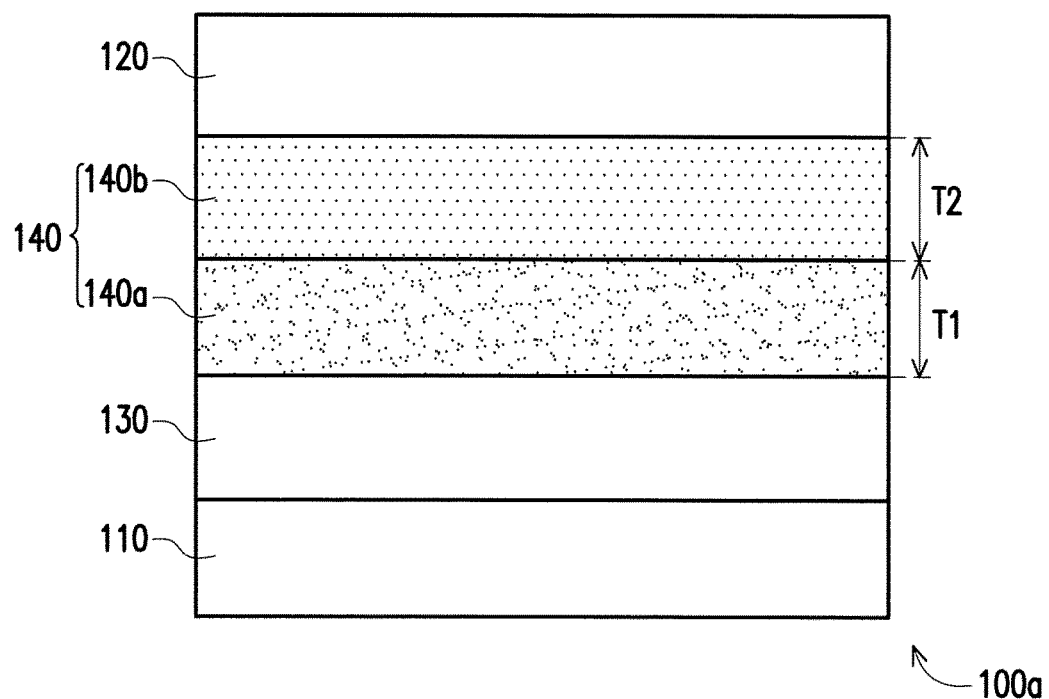
FIG. 1A is a schematic cross-sectional diagram illustrating a semiconductor structure according to an embodiment of the disclosure.

FIG. 1A is a schematic cross-sectional diagram illustrating a semiconductor structure according to an embodiment of the disclosure. Referring to FIG. 1A, in the present embodiment, a semiconductor structure 100a includes a first-type semiconductor layer 110, a second-type semiconductor layer 120, a light emitting layer 130 and a hole supply layer 140. The light emitting layer 130 is disposed between the first-type semiconductor layer 110 and the second-type semiconductor layer 120. The hole supply layer 140 disposed between the light emitting layer 130 and the second-type semiconductor layer 120, and the hole supply layer 140 includes a first hole supply layer 140a and a second hole supply layer 140b. The first hole supply layer 140a is disposed between the light emitting layer 130 and the second hole supply layer 140b, and a chemical formula of the first hole supply layer 140a is $Al_{x1}In_{y1}Ga_{1-x1-y1}N$, wherein $0 \leq x1 < 0.4$ and $0 \leq y1 < 0.4$. The second hole supply layer 140b is disposed between the first hole supply layer 140a and the second-type semiconductor layer 120, and a chemical formula of the second hole supply layer 140b is $Al_{x2}In_{y2}Ga_{1-x2-y2}N$, wherein $0 \leq x2 < 0.4$, $0 \leq y2 < 0.4$, and $x1 > x2$.

In details, materials of the first-type semiconductor layer 110 and the second-type semiconductor layer 120 are, for example, gallium nitride (GaN), respectively, wherein the first-type semiconductor layer 110 is, for example, a N-type semiconductor layer, the second-type semiconductor layer 120 is, for example, a P-type semiconductor layer, and the light emitting layer 130 is, for example, a multiple quantum well structure. The value of x1 in the chemical formula of the first hole supply layer 140a is greater than the value of x2 in the chemical formula of the second hole supply layer 140b. That is to say, an aluminum (Al) content in the first hole supply layer 140a is greater than an aluminum (Al) content in the second hole supply layer 140b. Preferably, the value of x1 and the value of x2 are ranged between 0.05 and 0.25, otherwise, in another embodiment, an aluminum concentration in the first hole supply layer 140a may be $3 \times 10^{20}$ atom/cm$^3$, and an aluminum concentration in the second hole supply layer 140b may be $9 \times 10^{19}$ atom/cm$^3$. If the value of x1 and the value of x2 are too large, then it can easily lead to a drop in epitaxial quality or an increase in material resistance, and if the value of x1 and the value of x2 are too small, then it can easily cause a poor electron impedance effect.

Furthermore, a thickness T1 of the first hole supply layer 140a of the present embodiment is, for example, greater than or equal to 2 nm and smaller than or equal to 50 nm. A thickness T2 of the second hole supply layer 140b is, for example, greater than or equal to 2 nm and smaller than equal to 50 nm. Preferably, the thickness T1 of the first hole supply layer 140a and the thickness T2 of the second hole supply layer 140b are ranged between 5 nm and 20 nm. If the thickness T1 of the first hole supply layer 140a and the thickness T2 of the second hole supply layer 140b are too large, then it can easily lead to a drop in epitaxial quality or an increase in material resistance, and if the thickness T1 of the first hole supply layer 140a and the thickness T2 of the second hole supply layer 140b are too small, then it can easily cause a poor electron impedance effect. The thickness T1 of the first hole supply layer 140a can be greater than, equal to or smaller than the thickness T2 of the second hole supply layer 140b, such that the disclosure is not limited thereto.

Figure 1B:
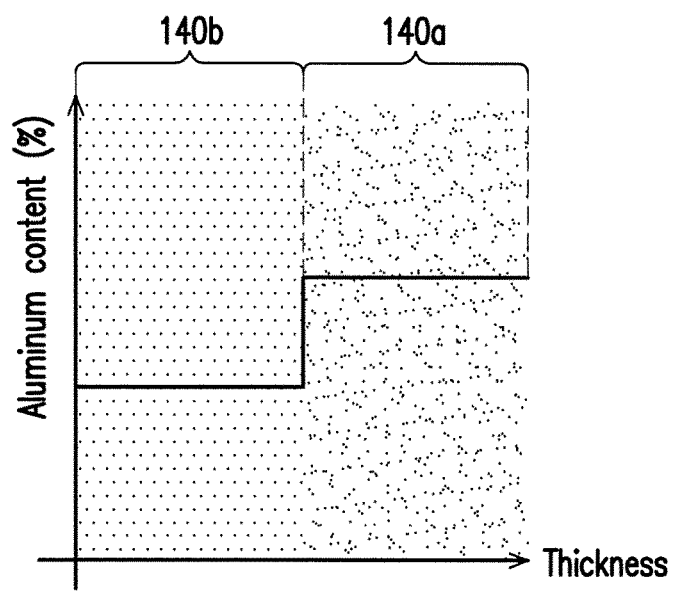
FIG. 1B to FIG. 1D are schematic diagrams illustrating a variety of forms and relationships between the aluminum content and the thickness for a first hole supply layer and a second hole supply layer of FIG. 1A.
Figure 1C:
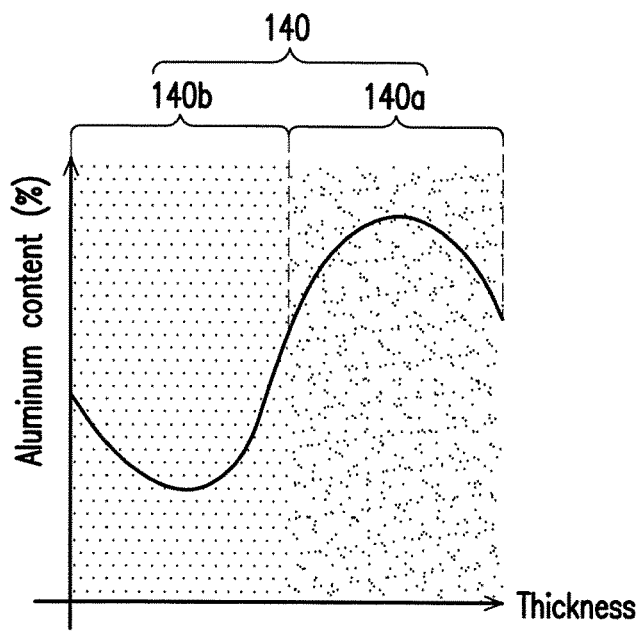
Figure 1D:
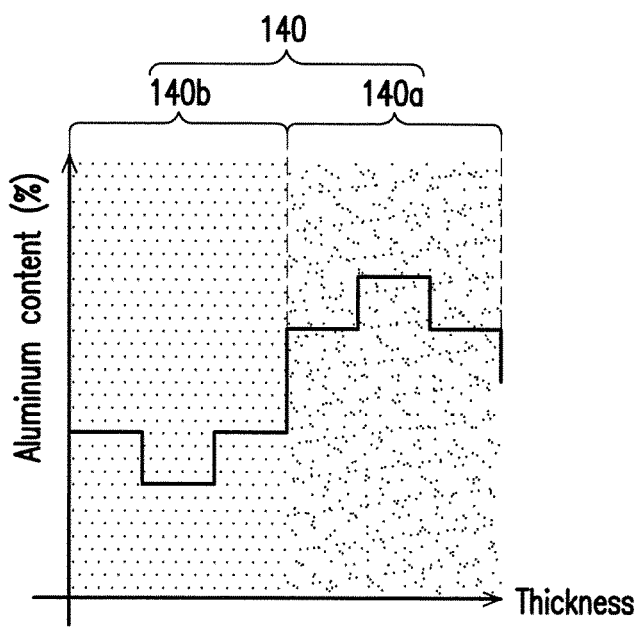

FIG. 1B to FIG. 1D are schematic diagrams illustrating a variety of forms and relationships between the aluminum content and the thickness for a first hole supply layer and a second hole supply layer of FIG. 1A. In the present embodiment, aluminum (Al) content in the first hole supply layer 140a in the hole supply layer 140 is greater than the aluminum (Al) content in the second hole supply layer 140b. That is to say, the aluminum (Al) content in the hole supply layer 140 is adjustable, and the aluminum (Al) content at where is nearby the light emitting layer 130 is greater than the aluminum (Al) content at where is nearby the second-type semiconductor layer 120. Particularly, referring to FIG. 1B, the aluminum (Al) content in the first hole supply layer 140a does not vary along with a change in an epitaxial thickness of the first hole supply layer 140a, that is, the value of x1 in the chemical formula of the first hole supply layer 140a is a fixed value. On the other hand, the aluminum (Al) content in the second hole supply layer 140b also does not vary along with a change in an epitaxial thickness of the second hole supply layer 140b, that is, the value of x2 in the chemical formula of the second hole supply layer 140b is also a fixed value, and $x1 > x2$.

Otherwise, referring to FIG. 1A and FIG. 1C together, the aluminum (Al) content in the first hole supply layer 140a and the aluminum (Al) content in the second hole supply layer 140b represent a gradient distribution along with the epitaxial thickness of the first hole supply layer 140a and the epitaxial thickness of the second hole supply layer 140b. That is to say, the value of x1 and the value of x2 in the chemical formulae of the first hole supply layer 140a and the second hole supply layer 140b respectively represent a continuous gradient distribution along with the thickness T1 of the first hole supply layer 140a and the thickness T2 of the second hole supply layer 140b, and $x1 > x2$. Through the arrangement of the continuous and gradually changing first hole supply layer 140a and second hole supply layer 140b, a phenomenon of lattice mismatch being extended in a thickness direction can effectively be reduced, thereby improving the quality of the overall semiconductor structure 100a.

Otherwise, referring to FIG. 1A and FIG. 1D together, the aluminum (Al) content in the first hole supply layer 140a and the aluminum (Al) content in the second hole supply layer 140b respectively represent a stepped distribution along with the epitaxial thickness of the first hole supply layer 140a and the epitaxial thickness of the second hole supply layer 140b. That is to say, the value of x1 and the value of x2 in the chemical formulae of the first hole supply layer 140a and the second hole supply layer 140b respectively represent a stepped distribution along with the thickness T1 of the first hole supply layer 140a and the thickness T2 of the second hole supply layer 140b, and $x1 > x2$, and thus a phenomenon of lattice mismatch being extended in a thickness direction can effectively be reduced, thereby improving the quality of the overall semiconductor structure 100a.

In brief, since the semiconductor structure 100a of the present embodiment has the hole supply layer 140, more holes can be provided to enter the light emitting layer 130 so that combinations of electron and hole can be increased. In addition, a material of the hole supply layer 140 of the present embodiment is aluminum indium gallium nitride ($Al_xIn_yG_{a1-x-y}N$), and by adjusting the aluminum content in the hole supply layer 140, in addition to effectively confining the electrons and the holes within the light emitting layer 130 to effectively enhance the electron impedance performance, a rise in voltage can also be effectively prevented.

It is to be explained that, the following embodiments have adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2A:
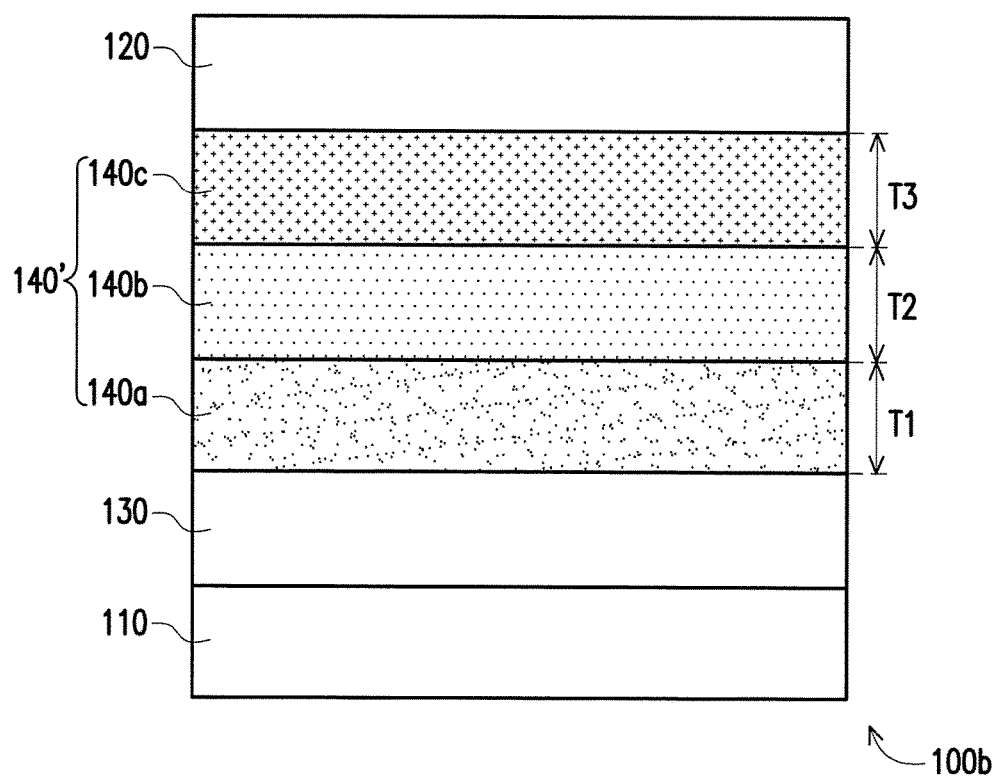
FIG. 2A is a schematic cross-sectional diagram illustrating a semiconductor structure according to another embodiment of the disclosure.

FIG. 2A is a schematic cross-sectional diagram illustrating a semiconductor structure according to another embodiment of the disclosure. Referring to FIG. 2A, a semiconductor structure 100b of the present embodiment is similar to the semiconductor structure 100a of FIG. 1A, but there is a main difference between the two in that: the hole supply layer 140' further includes a third hole supply layer 140c, wherein the third hole supply layer 140c is disposed between the second hole supply layer 140b and the second-type semiconductor layer 120, and a chemical formula of the third hole supply layer 140c is $Al_{x3}In_{y3}Ga_{1-x3-y3}N$, wherein $0 \leq x3 < 0.4$, $0 \leq y3 < 0.4$, and $x3 > x2$. In another embodiment, an aluminum concentration in the third hole supply layer 140c can be $1.5 \times 10^{20}$ atom/cm$^3$.

Figure 2B:
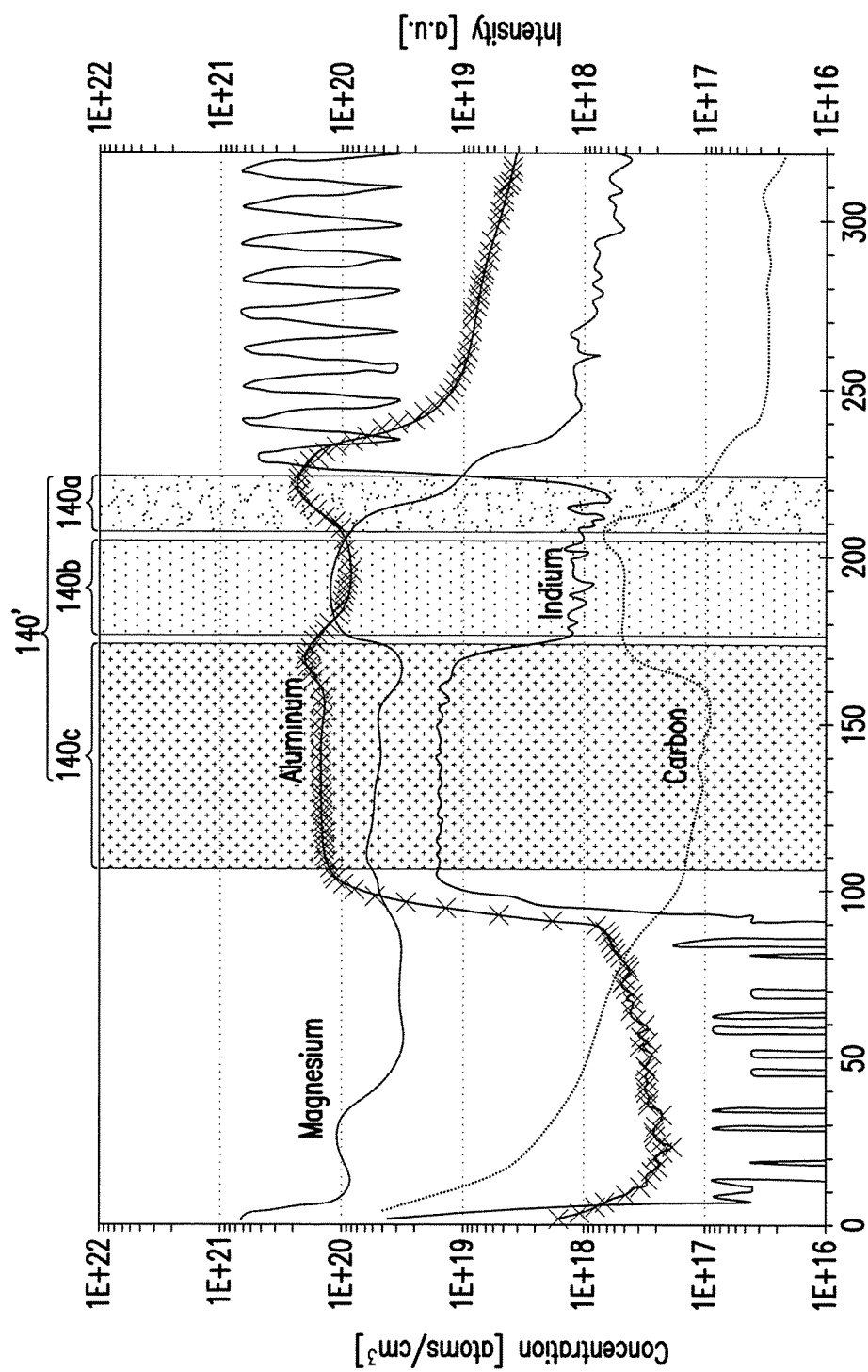
FIG. 2B is a secondary ion mass spectrometry measurement diagram illustrating the aluminum content, the magnesium content, the carbon content and the indium content in a first hole supply layer, a second hole supply layer and a third hole supply layer of FIG. 2A.

FIG. 2B is a secondary ion mass spectrometry measurement diagram illustrating the aluminum content, the magnesium content, the carbon content and the indium content in the first hole supply layer, the second hole supply layer and the third hole supply layer of FIG. 2A. Referring to FIG. 2B, in order to increase a concentration of the holes, the first hole supply layer 140a of the present embodiment can also be doped with a first dopant in a concentration, for example, greater than or equal to $3 \times 10^{17}$ atom/cm$^3$, wherein the first dopant is carbon (C). Certainly, the first hole supply layer 140a can also further be doped with a second dopant in a concentration, for example, greater than or equal to $10^{19}$ atom/cm$^3$, and the second dopant is magnesium (Mg). By doping with the first dopant (carbon) and the second dopant (magnesium), the first hole supply layer 140a can has a high hole concentration so that more holes can be provided to enter the light emitting layer 130, thereby increasing the combinations of electron and hole. Similarly, the second hole supply layer 140b of the present embodiment can also be doped with a first dopant in a concentration, for example, greater than or equal to $3 \times 10^{17}$ atom/cm$^3$, wherein the first dopant is carbon (C). Certainly, the second hole supply layer 140b can also further be doped with a second dopant in a concentration, for example, greater than or equal to $10^{19}$ atom/cm$^3$, wherein the second dopant is magnesium (Mg). By doping with the first dopant (carbon) and the second dopant (magnesium), the second hole supply layer 140b can has a high concentration so that more holes can be provided to enter the light emitting layer 130, thereby increasing the combinations of electron and hole. Similarly, the third hole supply layer 140c of the present embodiment can also be doped with a first dopant in a concentration, for example, greater than or equal to $3 \times 10^{17}$ atom/cm$^3$, wherein the first dopant is carbon (C). Certainly, the third hole supply layer 140c can also further be doped with a second dopant in a concentration, for example, greater than or equal to $10^{19}$ atom/cm$^3$, wherein the second dopant is magnesium (Mg). In another embodiment, the third hole supply layer 140c can be a second-type semiconductor layer which is only doped with the second dopant, such as p-AlGaN. Preferably, the aluminum content in the first hole supply layer 140a is greater than the aluminum content in the second hole supply layer 140b, and the aluminum content in the third hole supply layer 140c is greater than the aluminum content in the second hole supply layer 140b. For instance, an aluminum concentration in the first hole supply layer 140a can be $3 \times 10^{20}$ atom/cm$^3$, an aluminum concentration in the second hole supply layer 140b can be $9 \times 10^{19}$ atom/cm$^3$, and an aluminum concentration in the third hole supply layer 140c can be $1.5 \times 10^{20}$ atom/cm$^3$.

Figure 2C:
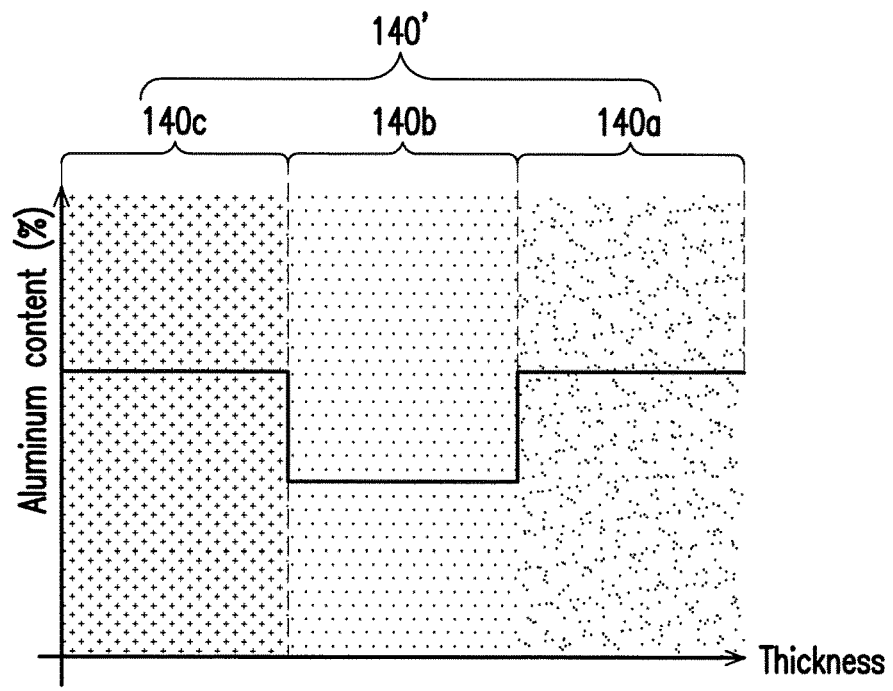
FIG. 2C to FIG. 2E are schematic diagrams illustrating a variety of forms and relationships between the aluminum content and the thickness for a first hole supply layer, a second hole supply layer and a third hole supply layer of FIG. 2A.
Figure 2D:
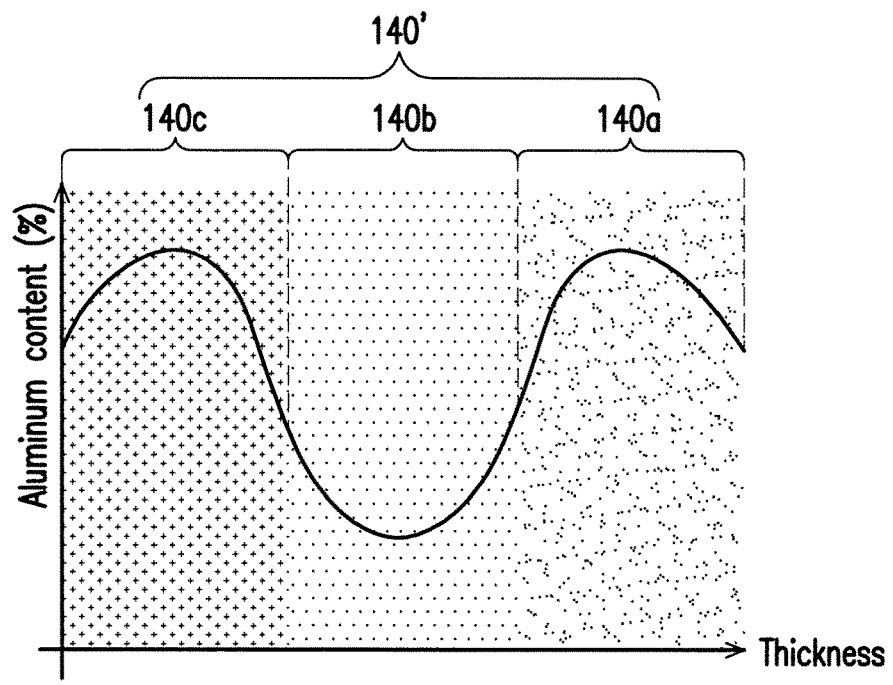
Figure 2E:
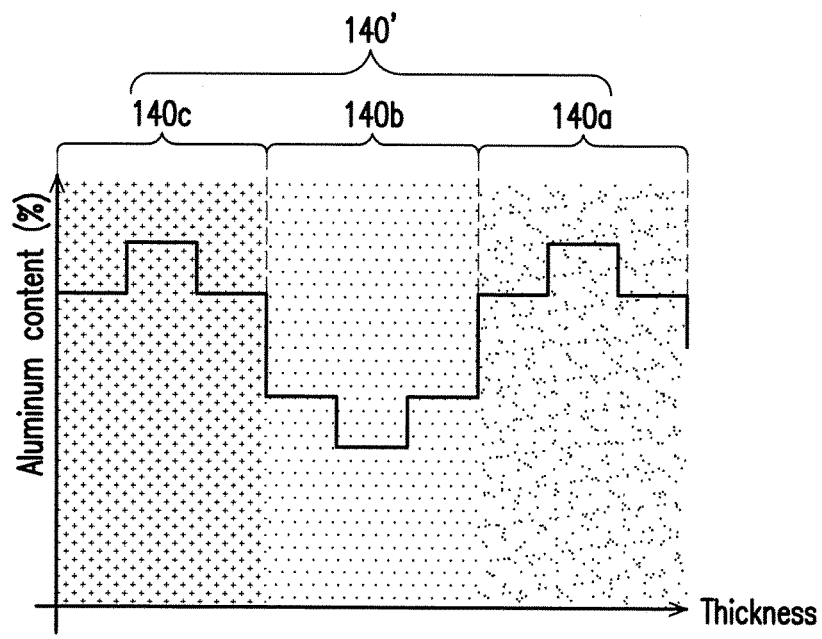

FIG. 2C to FIG. 2E are schematic diagrams illustrating a variety of forms and relationships between the aluminum content and the thickness for the first hole supply layer, the second hole supply layer and the third hole supply layer of FIG. 2A. In the present embodiment, the aluminum (Al) content in the first hole supply layer 140a of the hole supply layer 140' is greater than the aluminum (Al) content in the second hole supply layer 140b, and the aluminum (Al) content in the third hole supply layer 140c of the hole supply layer 140' is greater than the aluminum (Al) content in the second hole supply layer 140b. That is to say, the aluminum (Al) content in the hole supply layer 140' is adjustable, and the aluminum (Al) content at where is nearby the light emitting layer 130 and the aluminum (Al) content at where is nearby the second-type semiconductor layer 120 are the highest. Particularly, referring to FIG. 2C, the aluminum (Al) content in the first hole supply layer 140a does not vary along with a change in an epitaxial thickness of the first hole supply layer 140a, that is, the value of x1 in the chemical formula of the first hole supply layer 140a is a fixed value. On the other hand, the aluminum (Al) content in the second hole supply layer 140b also does not vary along with a change in an epitaxial thickness of the second hole supply layer 140b, that is, the value of x2 in the chemical formula of the second hole supply layer 140b is also a fixed value, and x1>x2. The aluminum (Al) content in the third hole supply layer 140c also does not vary along with a change in an epitaxial thickness of the third hole supply layer 140c, that is, the value of x3 in the chemical formula of the third hole supply layer 140c is also a fixed value, and x3>x2.

Otherwise, referring to FIG. 2A and FIG. 2D together, the aluminum (Al) content in the first hole supply layer 140a, the aluminum (Al) content in the second hole supply layer 140b and the aluminum (Al) content in the third hole supply layer 140c of the hole supply layer 140' respectively represent a continuous gradient distribution along with the epitaxial thickness of the first hole supply layer 140a, the epitaxial thickness of the second hole supply layer 140b and the epitaxial thickness of the third hole supply layer 140c. That is to say, the value of x1, the value of x2 and the value of x3 in the chemical formulae of the first hole supply layer 140a, the second hole supply layer 140b and the third hole supply layer 140c respectively represent a continuous gradient distribution along with the thickness T1 of the first hole supply layer 140a, the thickness T2 of the second hole supply layer 140b and the thickness T3 of the third hole supply layer 140c, wherein x1>x2 and x3>x2. Through the arrangement of the continuous and gradually changing first hole supply layer 140a, second hole supply layer 140b and third hole supply layer 140c, a phenomenon of lattice mismatch being extended in a thickness direction can effectively be reduced, thereby improving the quality of the overall semiconductor structure 100b.

Otherwise, referring to FIG. 2A and FIG. 2E together, the aluminum (Al) content in the first hole supply layer 140a, the aluminum (Al) content in the second hole supply layer 140b and the aluminum (Al) content in the third hole supply layer 140c of the hole supply layer 140' respectively represent a stepped distribution along with the epitaxial thickness of the first hole supply layer 140a, the epitaxial thickness of the second hole supply layer 140b and the epitaxial thickness of the third hole supply layer 140c. That is to say, the value of x1, the value of x2 and the value of x3 in the chemical formulae of the first hole supply layer 140a, the second hole supply layer 140b and the third hole supply layer 140c respectively represent a stepped distribution along with the thickness T1 of the first hole supply layer 140a, the thickness T2 of the second hole supply layer 140b and the thickness T3 of the third hole supply layer 140b, wherein x1>x2 and x3>x2. Through the arrangement of the first hole supply layer 140a, the second hole supply layer 140b and the third hole supply layer 140c each having a stepped wisely distributed aluminum (Al) content variation, a phenomenon of lattice mismatch being extended in a thickness direction can effectively be reduced, thereby improving the quality of the overall semiconductor structure 100b.

In brief, since the semiconductor structure 100b of the present embodiment has the hole supply layer 140', more holes can be provided to enter the light emitting layer 130 so that combinations of electron and hole can be increased. In addition, a material of the hole supply layer 140' of the present embodiment is aluminum indium gallium nitride ($Al_xIn_yGa_{1-x-y}N$), and by adjusting the aluminum content in the hole supply layer 140', in addition to effectively confining the electrons and the holes within the light emitting layer 130 to effectively enhance the electron impedance performance, a rise in voltage can also be effectively prevented.

Figure 3A:
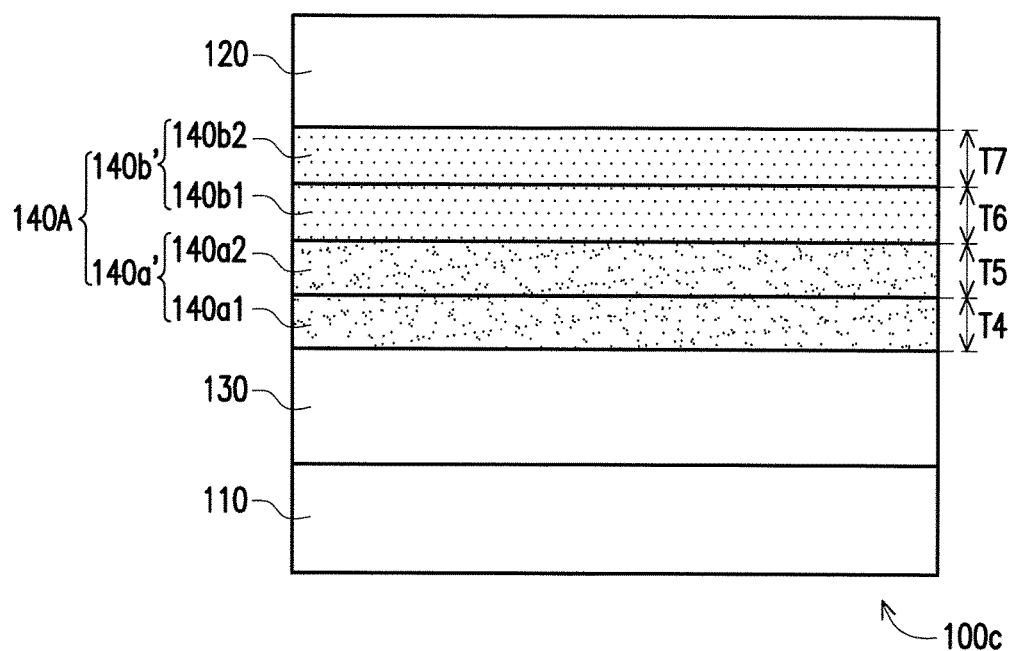
FIG. 3A is a schematic cross-sectional diagram illustrating a semiconductor structure according to another embodiment of the disclosure.

FIG. 3A is a schematic cross-sectional diagram illustrating a semiconductor structure according to another embodiment of the disclosure. Referring to FIG. 3A, a semiconductor structure 100c of the present embodiment is similar to the semiconductor structure 100a of FIG. 1A, but there is a main difference between the two in that: the first hole supply layer 140a' of the hole supply layer 140A of the present embodiment includes at least one first sub-hole supply layer 140a1 (only one is being schematically illustrated in FIG. 3A) and at least one second sub-hole supply layer 140a2 (only one is being schematically illustrated in FIG. 3A). A chemical formula of the first sub-hole supply layer 140a1 is $Al_{x1a}In_{y1a}Ga_{1-x1a-y1a}N$, wherein $0 \leq x1a < 0.4$ and $0 \leq y1a < 0.4$. A chemical formula of the second sub-hole supply layer 140a2 is $Al_{x1b}In_{y1b}Ga_{1-x1b-y1b}N$, wherein $0 \leq x1b < 0.4$ and $0 \leq y1b < 0.4$. A thickness T4 of the first sub-hole supply layer 140a1 and a thickness T5 of the second sub-hole supply layer 140a2 are, for example, respectively greater than or equal to 1 nm and smaller than 30 nm.

On the other hand, the second hole supply layer 140b' of the hole supply layer 140A includes at least one third sub-hole supply layer 140b1 (only one is being schematically illustrated in FIG. 3A) and at least one fourth sub-hole supply layer 140b2 (only one is being schematically illustrated in FIG. 3A). A chemical formula of the third sub-hole supply layer 140b1 is $Al_{x2a}In_{y2a}Ga_{1-x2a-y2a}N$, wherein $0 \leq x2a < 0.4$ and $0 \leq y2a < 0.4$. A chemical formula of the fourth sub-hole supply layer 140b2 is $Al_{x2b}In_{y2b}Ga_{1-x2b-y2b}N$, wherein $0 \leq x2b < 0.4$ and $0 \leq y2b < 0.4$. A thickness T6 of the third sub-hole supply layer 140b1 and a thickness T7 of the fourth sub-hole supply layer 140b2 are, for example, respectively, greater than or equal to 1 nm and smaller than 30 nm.

Figure 3B:
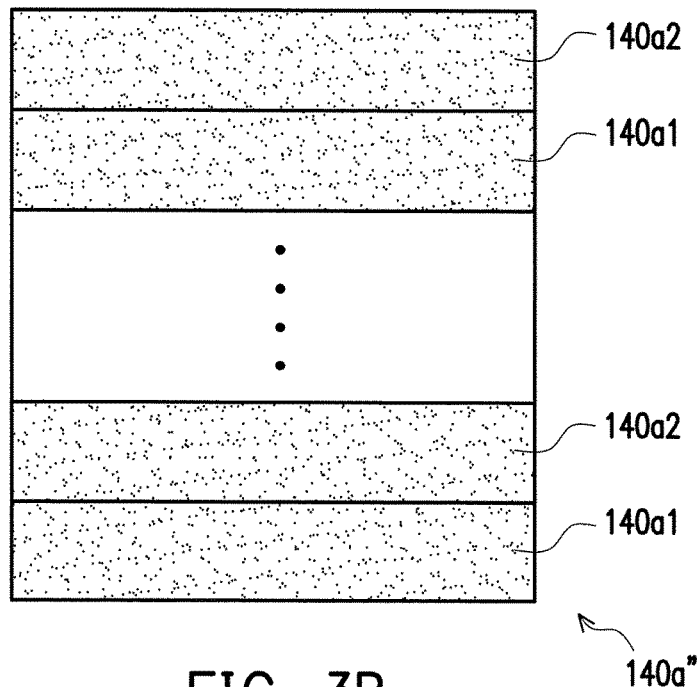
FIG. 3B is a schematic diagram illustrating another form of a first hole supply layer in FIG. 3A.

Certainly, in other embodiment, referring to FIG. 3B, the first hole supply layer 140a" may also include a plurality of first sub-hole supply layers 140a1 and a plurality of second sub-hole supply layers 140a2, wherein the first sub-hole supply layers 140a1 and the second sub-hole supply layers 140a2 appear to be alternately stacked. One first sub-hole supply layer 140a1 and one second sub-hole supply layer 140a2 are together being defined as a pair of sub-hole supply layers. Preferably, the first hole supply layer 140a" at least include one pair of sub-hole supply layers, and at most 200 pairs of sub-hole supply layers. Similarly, referring to FIG. 3C, the second hole supply layer 140b" may also include a plurality of third sub-hole supply layers 140b1 and a plurality of fourth sub-hole supply layers 140b2, wherein the third sub-hole supply layers 140b1 and the fourth sub-hole supply layers 140b2 appear to be alternately stacked. One third sub-hole supply layer 140b1 and one fourth sub-hole supply layer 140b2 are together being defined as a pair of sub-hole supply layers. Preferably, the second hole supply layer 140b" at least include one pair of sub-hole supply layers, and at most 200 pairs of sub-hole supply layers.

Figure 3C:
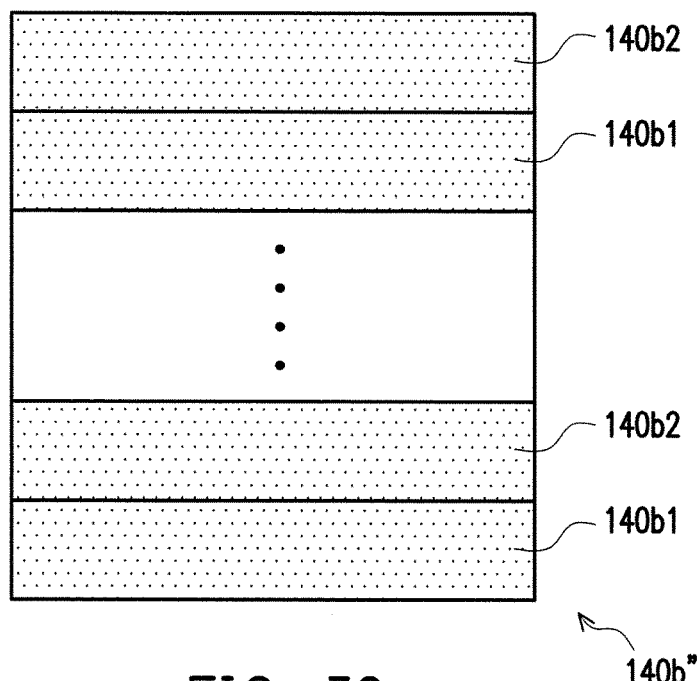
FIG. 3C is a schematic diagram illustrating another form of a second hole supply layer in FIG. 3A.
Figure 3D:
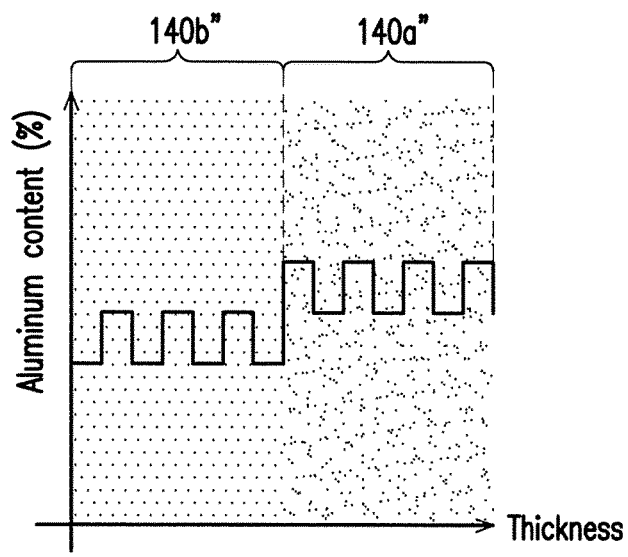
FIG. 3D is a schematic diagram illustrating relationships between the aluminum content and the thickness for a first hole supply layer and a second hole supply layer of FIG. 3B and FIG. 3C.

FIG. 3D is a schematic diagram illustrating relationships between the aluminum content and the thickness for the first hole supply layer and the second hole supply layer of FIG. 3B and FIG. 3C. It can clearly be known from FIG. 3D that, each of the first hole supply layer 140a" and the second hole supply layer 140b" in FIG. 3B and FIG. 3C is embodied as a superlattice hole supply layer. Since the aluminum (Al) contents in the first hole supply layer 140a" and the second hole supply layer 140b" have high and low variations, the inferiority in the epitaxial quality is liable to be caused, because the higher the aluminum contents the greater the mismatch in lattice constants. Therefore, by growing the superlattice with the aforementioned manner, in addition to increase an average doping concentration and the epitaxial quality, the electron impedance effect can also be effectively enhanced and a lattice defect can also be effectively prevented.

Figure 4A:
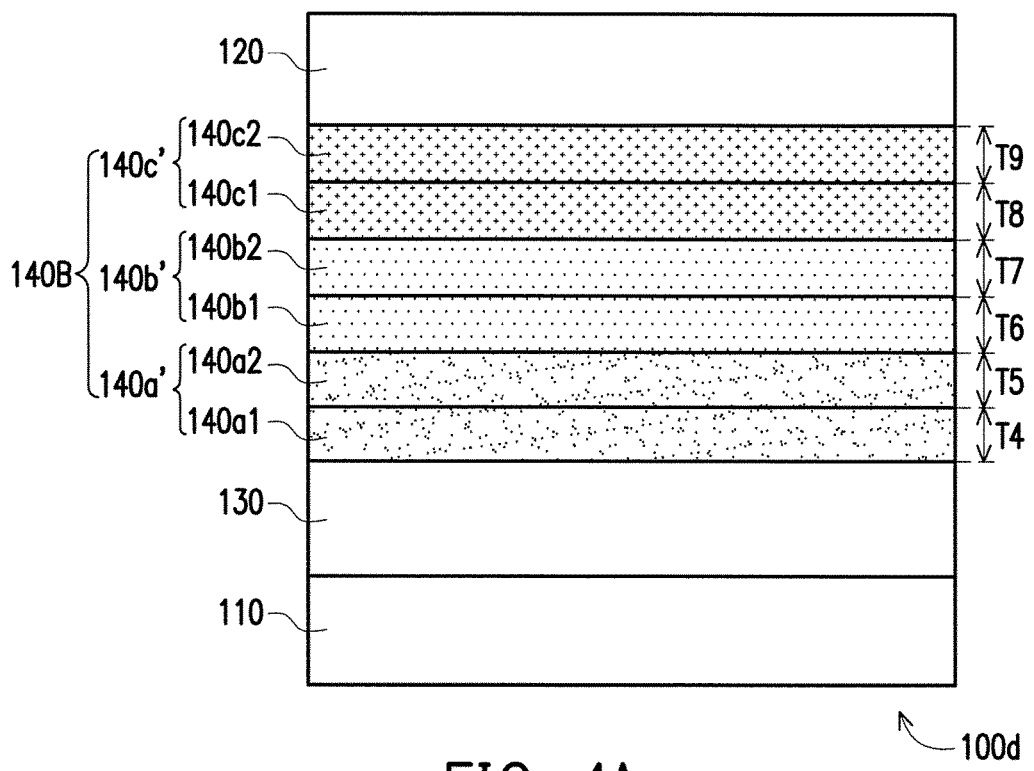
FIG. 4A is a schematic cross-sectional diagram illustrating a semiconductor structure according to another embodiment of the disclosure.

FIG. 4A is a schematic cross-sectional diagram illustrating a semiconductor structure according to another embodiment of the disclosure. Referring to FIG. 4A, a semiconductor structure 100d of the present embodiment is similar to the semiconductor structure 100c of FIG. 3A, but there is a main difference between the two in that: the third hole supply layer 140c' of the hole supply layer 140B of the present embodiment further includes at least one fifth sub-hole supply layer 140c1 (only one is being schematically illustrated in FIG. 4A) and at least one sixth sub-hole supply layer 140c2 (only one is being schematically illustrated in FIG. 4A). A chemical formula of the fifth sub-hole supply layer 140c1 is $Al_{x3a}In_{y3a}Ga_{1-x3a-y3a}N$, wherein $0 \leq x3a < 0.4$ and $0 \leq y3a < 0.4$. A chemical formula of the sixth sub-hole supply layer 140c2 is $Al_{x3b}In_{y3b}Ga_{1-x3b-y3b}N$, wherein $0 \leq x3b < 0.4$ and $0 \leq y3b < 0.4$. A thickness T8 of the fifth sub-hole supply layer 140c1 and a thickness T9 of the sixth sub-hole supply layer 140c2 are, for example, respectively greater than 1 nm and smaller than 30 nm.

Figure 4B:
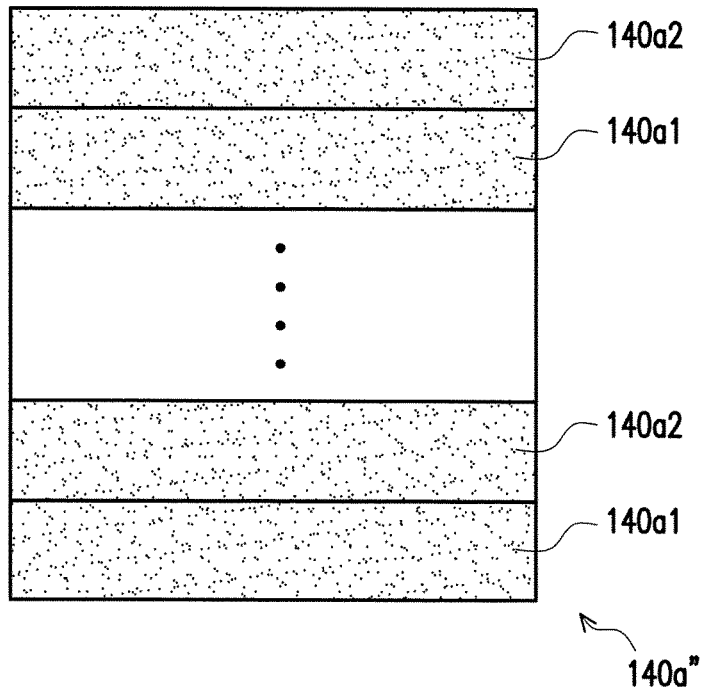
FIG. 4B is a schematic diagram illustrating another form of a first hole supply layer in FIG. 4A.

Certainly, in other embodiment, referring to FIG. 4B, the first hole supply layer 140a" may also include a plurality of first sub-hole supply layers 140a1 and a plurality of second sub-hole supply layers 140a2, wherein the first sub-hole supply layers 140a1 and the second sub-hole supply layers 140a2 appear to be alternately stacked. One first sub-hole supply layer 140a1 and one second sub-hole supply layer 140a2 are together being defined as a pair of sub-hole supply layers. Preferably, the first hole supply layer 140a" at least include one pair of sub-hole supply layers, and at most 200 pairs of sub-hole supply layers. Similarly, referring to FIG. 4C, the second hole supply layer 140b" may also include a plurality of third sub-hole supply layers 140b1 and a plurality of fourth sub-hole supply layers 140b2, wherein the third sub-hole supply layers 140b1 and the fourth sub-hole supply layers 140b2 appear to be alternately stacked. One third sub-hole supply layer 140b1 and one fourth sub-hole supply layer 140b2 are together being defined as a pair of sub-hole supply layers. Preferably, the second hole supply layer 140b" at least include one pair of sub-hole supply layers, and at most 200 pairs of sub-hole supply layers. Similarly, referring to FIG. 4D, the third hole supply layer 140c" may also include a plurality of fifth sub-hole supply layers 140c1 and a plurality of sixth sub-hole supply layers 140c2, wherein the fifth sub-hole supply layers 140c1 and the sixth sub-hole supply layers 140c2 appear to be alternately stacked. One fifth sub-hole supply layer 140c1 and one sixth sub-hole supply layer 140c2 are together being defined as a pair of sub-hole supply layers. Preferably, the third hole supply layer 140c" at least include one pair of sub-hole supply layers, and at most 200 pairs of sub-hole supply layers.

Figure 4C:
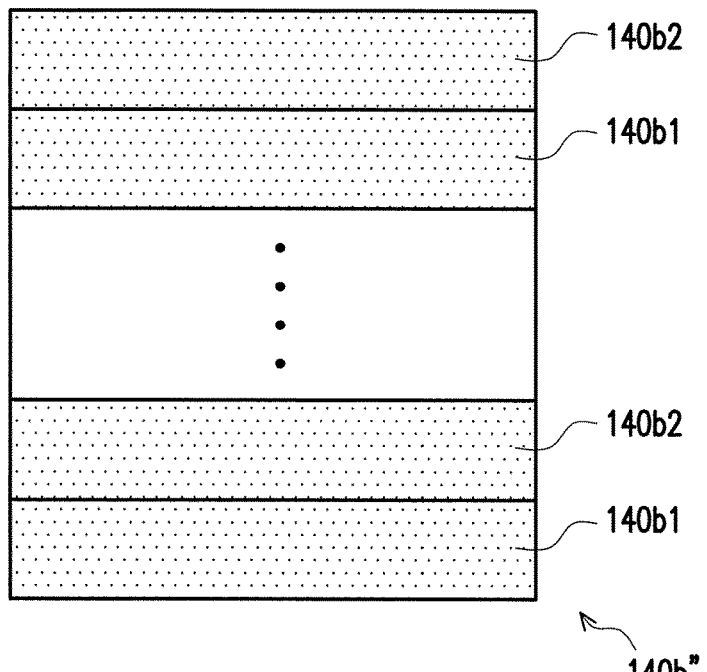
FIG. 4C is a schematic diagram illustrating another form of a second hole supply layer in FIG. 4A.
Figure 4D:
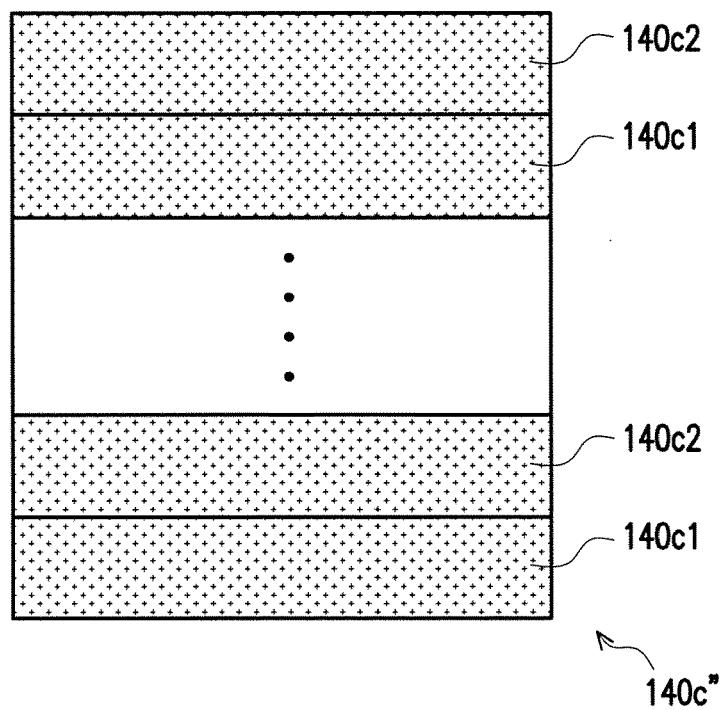
FIG. 4D is a schematic diagram illustrating another form of a third hole supply layer in FIG. 4A.
Figure 4E:
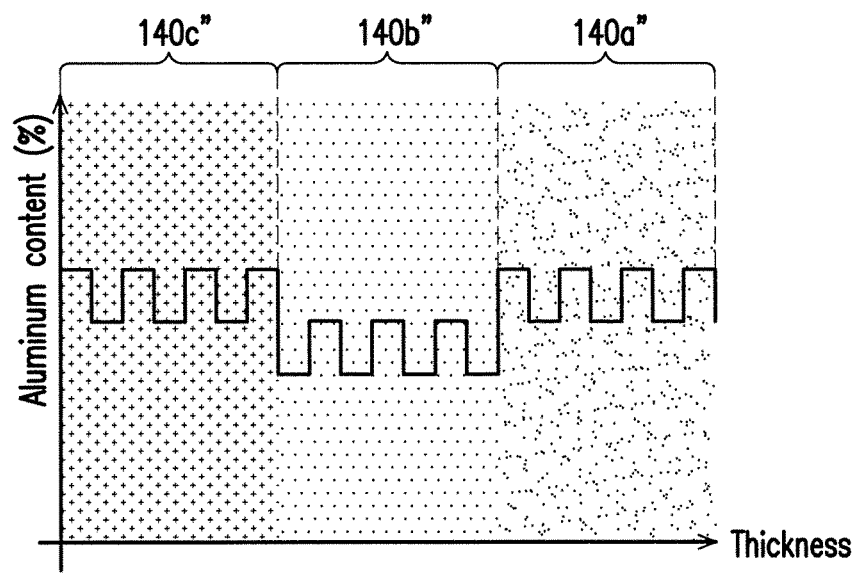
FIG. 4E is a schematic diagram illustrating relationships between the aluminum content and the thickness of a first hole supply layer, a second hole supply layer and a third hole supply layer of FIG. 4B, FIG. 4C and FIG. 4D.

FIG. 4E is a schematic diagram illustrating relationships between the aluminum content and the thickness of a first hole supply layer, a second hole supply layer and a third hole supply layer of FIG. 4B, FIG. 4C and FIG. 4D. It can clearly be known from FIG. 4E that, each of the first hole supply layer 140a'', the second hole supply layer 140b'' and the third hole supply layer 140c'' in FIG. 4B, FIG. 4C and FIG. 4D is embodied as a superlattice hole supply layer. Since the aluminum (Al) contents in the first hole supply layer 140a'', the second hole supply layer 140b'' and the third hole supply layer 140c'' have high and low variations, the inferiority in the epitaxial quality is liable to be caused, because the higher the aluminum contents the greater the mismatch in lattice constants. Therefore, by growing the superlattice with the aforementioned manner, in addition to increase an average doping concentration and the epitaxial quality, the electron impedance effect can also be effectively enhanced and a lattice defect can also be effectively prevented.

Figure 5A:
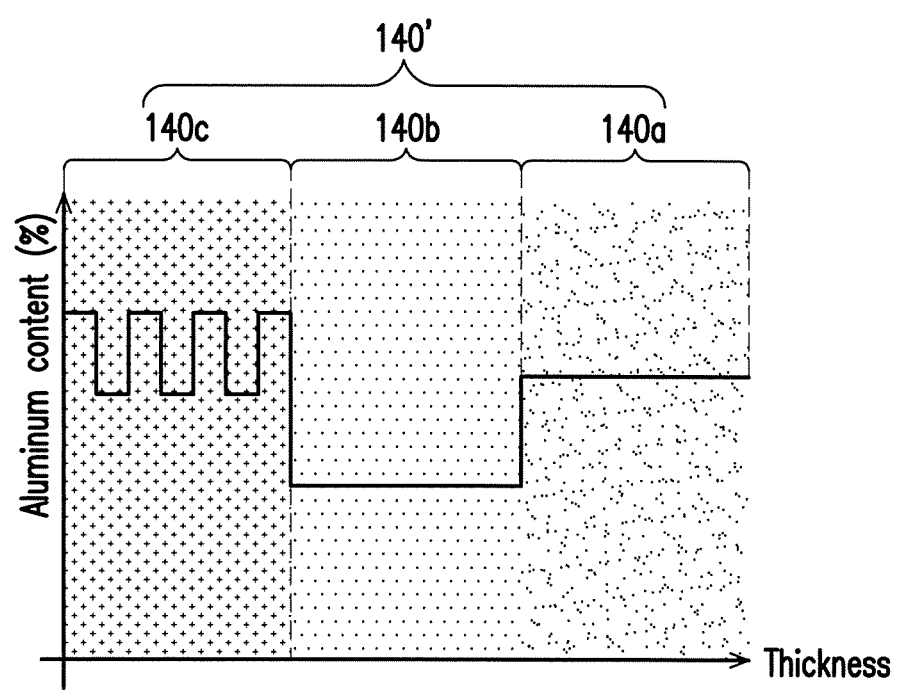
FIG. 5A to FIG. 5C are schematic diagrams illustrating relationships between the aluminum content and the thickness of a first hole supply layer, a second hole supply layer and a third hole supply layer according to an embodiment of the disclosure.
Figure 5B:
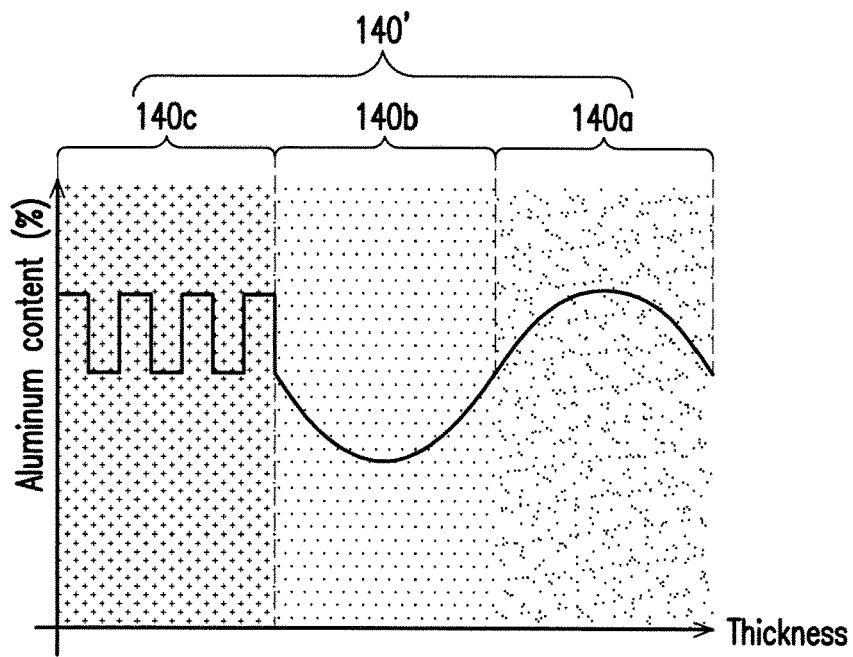
Figure 5C:
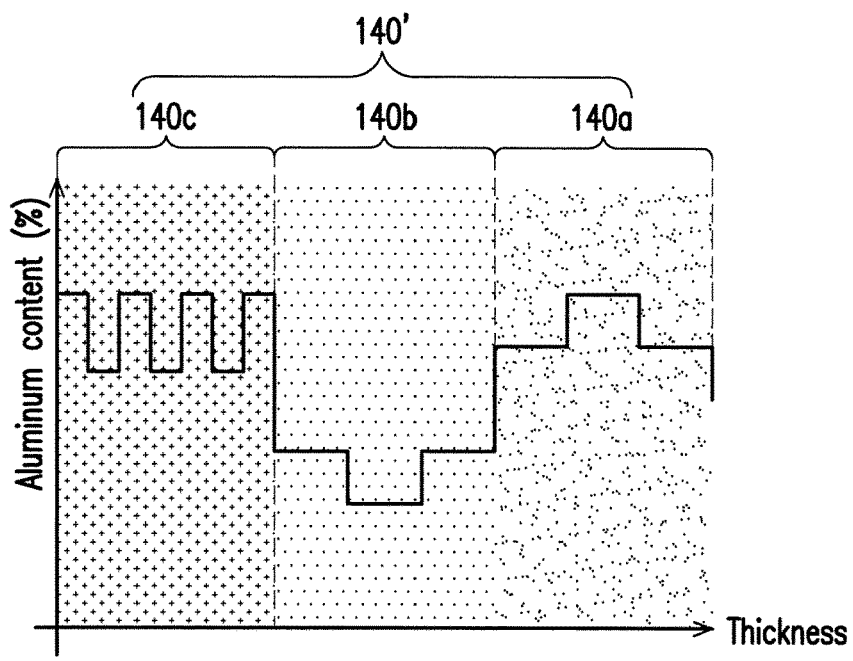

It is worth mentioning that, the disclosure only shows that the value of x1 in the chemical formula of the first hole supply layer 140a has to be greater than the value of x2 in the chemical formula of the second hole supply layer 140b, and the value of x3 in the chemical formula of the third hole supply layer 140c has to be greater than the value of x4 in the chemical formula of the second hole supply layer 140b. However, the disclosure does not intend to limit the relationships between the aluminum content and the thickness of the the first hole supply layer 140a, the second hole supply layer 140b and the third hole supply layer 140c. FIG. 5A to FIG. 5C are schematic diagrams illustrating the relationships between the aluminum content and the thickness of the first hole supply layer, the second hole supply layer and the third hole supply layer according to an embodiment of the disclosure. Referring to FIG. 2A and FIG. 5A together, the aluminum (Al) content in the first hole supply layer 140a of the hole supply layer 140' does not vary along with the change in the epitaxial thickness of the first hole supply layer 140a, that is, the value of x1 in the chemical formula of the first hole supply layer 140a is a fixed value. On the other hand, the aluminum (Al) content in the second hole supply layer 140b of the hole supply layer 140' also does not vary along with the change in the epitaxial thickness of the second hole supply layer 140b, that is, the value of x2 in the chemical formula of the second hole supply layer 140b is also a fixed value, and x1>x2. The third hole supply layer 140c of the hole supply layer 140' is embodied as a superlattice hole supply layer, and the value of x3 in the chemical formula of the third hole supply layer 140c is greater than the value of x2 in the chemical formula of the second hole supply layer 140b, that is, x3>x2.

Otherwise, referring to FIG. 2A and FIG. 5B together, the aluminum (Al) content in the first hole supply layer 140a and the aluminum (Al) content of the second hole supply layer 140b of the hole supply layer 140' respectively represent a continuous gradient distribution along with the epitaxial thickness of the first hole supply layer 140a and the epitaxial thickness of the second hole supply layer 140b. That is to say, the value of x1 and the value of x2 in the chemical formulae of the first hole supply layer 140a and the second hole supply layer 140b respectively represent a continuous gradient distribution along with the thickness T1 of the first hole supply layer 140a and the thickness T2 of the second hole supply layer 140b, wherein x1>x2. The third hole supply layer 140c is embodied as a superlattice hole supply layer, and the value of x3 in the chemical formula of the third hole supply layer 140c is greater than the value of x2 in the chemical formula of the second hole supply layer 140b, that is, x3>x2.

Otherwise, referring to FIG. 2A and FIG. 5C together, the aluminum (Al) content in the first hole supply layer 140a and the aluminum (Al) content in the second hole supply layer 140b of the hole supply layer 140' respectively represent a stepped distribution along with the epitaxial thickness of the first hole supply layer 140a and the epitaxial thickness of the second hole supply layer 140b. That is to say, the value of x1 and the value of x2 in the chemical formulae of the first hole supply layer 140a and the second hole supply layer 140b respectively represent a stepped distribution along with the thickness T1 of the first hole supply layer 140a and the thickness T2 of the second hole supply layer 140b, wherein x1>x2. The third hole supply layer 140c is embodied as a superlattice hole supply layer, and the value of x3 in the chemical formula of the third hole supply layer 140c 0c is greater than the value of x2 in the chemical formula of the second hole supply layer 140b, that is, x3>x2.

In addition, in other not shown embodiments, the first hole supply layer 140a and/or the second hole supply layer 140b may also be a superlattice hole supply layer, and the third hole supply layer 140c may also not be a superlattice hole supply layer. Those skilled in the art can select and match the aforesaid components based on their needs to achieve desired technical effects by referring to the descriptions of the aforementioned embodiments. As long as an average concentration of the aluminum (Al) content in the first hole supply layer 140a is greater than an average concentration of the aluminum (Al) content in the second hole supply layer 140b, the desired technical effects required by the disclosure can be achieved.

Figure 6:
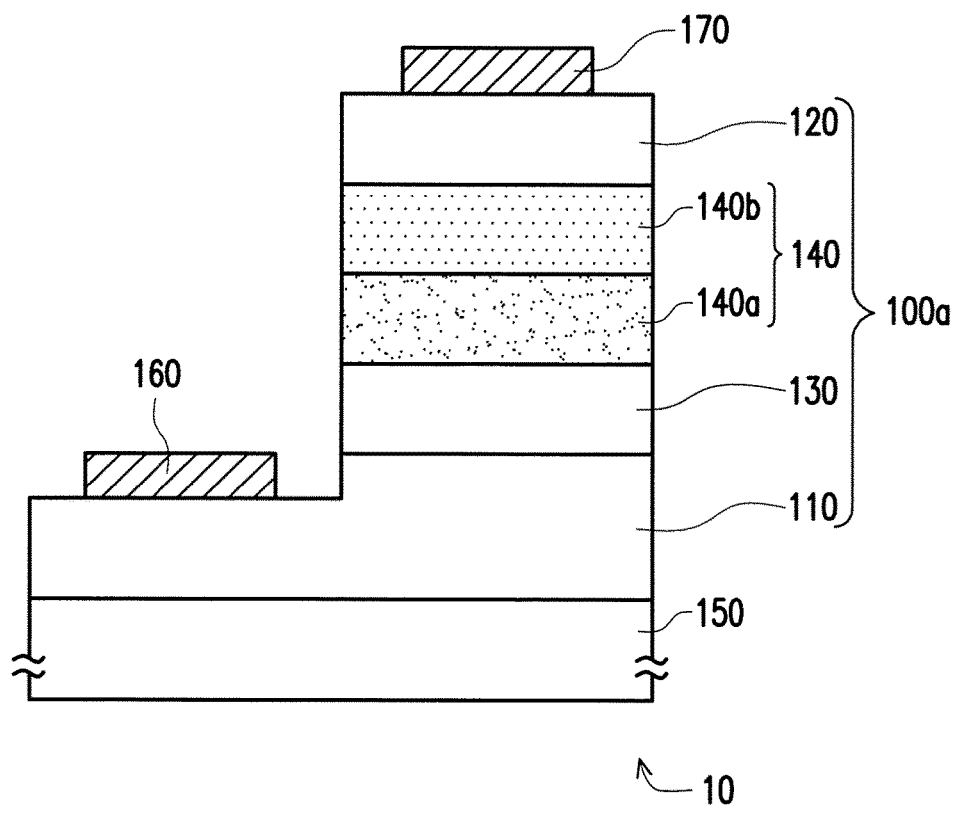
FIG. 6 is a cross-sectional schematic diagram illustrating a light emitting element according to an embodiment of the disclosure.

FIG. 6 is a cross-sectional schematic diagram illustrating a light emitting element according to an embodiment of the disclosure. Referring to FIG. 6, the light emitting element 10 of the present embodiment includes a substrate 150, the aforementioned semiconductor structure 100a, a first electrode 160 and a second electrode 170. The semiconductor structure 100a includes a first-type semiconductor layer 110, a second-type semiconductor layer 120, a light emitting layer 130 and a hole supply layer 140. The light emitting layer 130 is disposed between the first-type semiconductor layer 110 and the second-type semiconductor layer 120. The hole supply layer 140 is disposed between the light emitting layer 130 and the second-type semiconductor layer 120, and the hole supply layer 140 includes a first hole supply layer 140a and a second hole supply layer 140b. The first hole supply layer 140a is disposed between the light emitting layer 130 and the second hole supply layer 140b, and a chemical formula of the first hole supply layer 140a is $Al_{x1}In_{y1}Ga_{1-x1-y1}N$, wherein $0 \leq x1 < 0.4$ and $0 \leq y1 < 0.4$. The second hole supply layer 140b is disposed between the first hole supply layer 140a and the second-type semiconductor layer 120, and a chemical formula of the second hole supply layer 140b is $Al_{x2}In_{y2}Ga_{1-x2-y2}N$, wherein $0 \leq x2 < 0.4$, $0 \leq y2 < 0.4$, and x1>x2. The first electrode 160 is disposed on the first-type semiconductor layer 110 of the semiconductor structure 100a. The second electrode 170 is disposed on the second-type semiconductor layer 120 of the semiconductor structure 100a.

As shown in FIG. 6, the light emitting element 10 of the present embodiment is, for example, a flip-chip light emitting diode, wherein the light emitting layer 130 is embodied as a multiple quantum well structure. The first hole supply layer 140a can be doped with a first dopant in a concentration, for example, greater than or equal to $3 \times 10^{17}$ atom/cm$^3$, and the first dopant is carbon (C). The first hole supply layer 140a can also further be doped with a second dopant in a concentration, for example, greater than or equal to $10^{19}$ atom/cm$^3$, and the second dopant is magnesium (Mg). The purpose of doping the first hole supply layer 140a with the first dopant and the second dopant is to enable the first hole supply layer 140a to have a higher hole concentration, so that more holes can be provided to enter the light emitting layer 130, thereby increasing the combinations of electron and hole. Similarly, the second hole supply layer 140b can be doped with a first dopant in a concentration, for example, greater than or equal to $3 \times 10^{17}$ atom/cm$^3$, and the first dopant is carbon. The second hole supply layer 140b can also further be doped with a second dopant in a concentration, for example, greater than or equal to $1 \times 10^{19}$ atom/cm$^3$, and the second dopant is magnesium. The purpose of doping the second hole supply layer 140b with the first dopant and the second dopant is to enable the second hole supply layer 140b to have a higher hole concentration, so that more holes can be provided to enter the light emitting layer 130, thereby increasing the combinations of electron and hole.

Moreover, in other not shown embodiments, the light emitting element can also be selectively applied to the semiconductor structure 100b, 100c, 100d as described in the aforementioned embodiments. Those skilled in the art can select and match the aforesaid components based on their needs to achieve desired technical effects by referring to the descriptions of the aforementioned embodiments.

In summary, since the semiconductor structure of the disclosure has the hole supply layer, more holes can be provided to enter the light emitting layer so that combinations of electron and hole can be increased. Further, the material of the hole supply layer of the disclosure is aluminum indium gallium nitride ($Al_xIn_yGa_{1-x-y}N$), and by adjusting the aluminum content in the hole supply layer, in addition to effectively confining the electrons and the holes within the light emitting layer to effectively enhance the electron impedance performance, a rise in voltage can also be effectively prevented. In addition, by adopting the light emitting element of the semiconductor structure of the disclosure, a favorable light emitting efficiency can be obtained.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor structure, comprising:
a first-type semiconductor layer;
a second-type semiconductor layer;
a light emitting layer, disposed between the first-type semiconductor layer and the second-type semiconductor layer; and
a hole supply layer, being an AlInGaN based layer doped with carbon, disposed between the light emitting layer and the second-type semiconductor layer, wherein the hole supply layer comprises a first hole supply layer, a second hole supply layer and a third hole supply layer, the first hole supply layer is disposed between the light emitting layer and the second hole supply layer, the second hole supply layer is disposed between the first hole supply layer and the second-type semiconductor layer, and the third hole supply layer is disposed between the second hole supply layer and the second-type semiconductor layer, wherein an aluminum content in the first hole supply layer, as compared to an aluminum content in the second hole supply layer, has a first peak in terms of a concentration curve of aluminum, and an aluminum content in the third hole supply layer, as compared to the aluminum content in the second hole supply layer, has a second peak in terms of the concentration curve of aluminum,
wherein the first, second and third hole supply layers are doped with carbon in a concentration greater than or equal to $3 \times 10^{17}$ atom/cm$^3$.

2. The semiconductor structure of claim 1, wherein each of the first hole supply layer, the second hole supply layer and the third hole supply layer is a superlattice hole supply layer.

3. The semiconductor structure of claim 1, wherein a value of the first peak of the concentration curve of aluminum is greater than a value of the second peak of the concentration curve of aluminum.

4. The semiconductor structure of claim 1, wherein the first, second and third hole supply layers are doped with magnesium in a concentration greater than or equal to $10^{19}$ atom/cm$^3$.

5. The semiconductor structure of claim 4, wherein a magnesium content in the second hole supply layer, as compared to magnesium contents in the first hole supply layer and the third hole supply layer, has a third peak in terms of a concentration curve of magnesium.

6. A semiconductor structure, comprising:
a first-type semiconductor layer;
a second-type semiconductor layer;
a light emitting layer, disposed between the first-type semiconductor layer and the second-type semiconductor layer; and
a hole supply layer, disposed between the light emitting layer and the second-type semiconductor layer, the hole supply layer being an AlInGaN based layer, wherein the hole supply layer, a concentration curve of aluminum in the hole supply layer has two adjacent peaks comprising a first peak nearby the light emitting layer and a second peak nearby the second-type semiconductor layer,
wherein the hole supply layer is doped with magnesium in a concentration greater than or equal to $10^{19}$ atom/cm$^3$, and a concentration curve of magnesium in the hole supply layer has a third peak located between the first peak and the second peak of the concentration curve of aluminum.

7. The semiconductor structure of claim 6, wherein a value of the first peak of the concentration curve of aluminum is greater than a value of the second peak of the concentration curve of aluminum.

8. The semiconductor structure of claim 6, wherein the hole supply layer is doped with carbon in a concentration greater than or equal to $3 \times 10^{17}$ atom/cm$^3$.

9. A semiconductor structure, comprising:
a first-type semiconductor layer;
a second-type semiconductor layer;
a light emitting layer, disposed between the first-type semiconductor layer and the second-type semiconductor layer;
a first gallium nitride (GaN) based layer, comprising aluminum and indium, and disposed between the light emitting layer and the second-type semiconductor layer;
a second GaN based layer comprising aluminum and indium, disposed between the first GaN based layer and the second-type semiconductor layer; and
a third GaN based layer, comprising aluminum and indium, and disposed between the second GaN based layer and the second-type semiconductor layer, wherein an aluminum content in the first GaN based layer, as compared to an aluminum content in the second GaN based layer, has a first peak in terms of the concentration curve of aluminum, and an aluminum content in the third GaN based layer, as compared to the aluminum content in the second GaN based layer, has a second peak in terms of the concentration curve of aluminum, wherein the first, second and third GaN based layers are doped with magnesium in a concentration greater than or equal to $10^{19}$ atom/cm$^3$, and the first GaN based layer is doped with carbon in a concentration greater than or equal to $3 \times 10^{17}$ atom/cm$^3$.

10. The semiconductor structure of claim 9, wherein the second GaN based layer is doped with carbon in a concentration greater than or equal to $3 \times 10^{17}$ atom/cm$^3$.

11. The semiconductor structure of claim 9, wherein the second and third GaN based layers are doped with carbon in concentrations greater than or equal to $3 \times 10^{17}$ atom/cm$^3$.

12. The semiconductor structure of claim 9, wherein a value of the first peak of the concentration curve of aluminum is greater than a value of the second peak of the concentration curve of aluminum.

13. The semiconductor structure of claim 9, wherein a magnesium content in the second GaN based layer, as compared to magnesium contents in the first GaN based layer and the third GaN based layer, has a third peak in terms of a concentration curve of magnesium.

14. A semiconductor structure, comprising:
a first-type semiconductor layer;
a second-type semiconductor layer;
a light emitting layer, disposed between the first-type semiconductor layer and the second-type semiconductor layer; and
a hole supply layer, being an AlInGaN based layer doped with carbon, disposed between the light emitting layer and the second-type semiconductor layer, wherein the hole supply layer comprises a first hole supply layer, a second hole supply layer and a third hole supply layer, the first hole supply layer is disposed between the light emitting layer and the second hole supply layer, the second hole supply layer is disposed between the first hole supply layer and the second-type semiconductor layer, and the third hole supply layer is disposed between the second hole supply layer and the second-type semiconductor layer, wherein an aluminum content in the first hole supply layer, as compared to an aluminum content in the second hole supply layer, has a first peak in terms of a concentration curve of aluminum, and an aluminum content in the third hole supply layer, as compared to the aluminum content in the second hole supply layer, has a second peak in terms of the concentration curve of aluminum, wherein the first, second and third hole supply layers are doped with magnesium in a concentration greater than or equal to $10^{19}$ atom/cm$^3$.

15. The semiconductor structure of claim 14, wherein each of the first hole supply layer, the second hole supply layer and the third hole supply layer is a superlattice hole supply layer.

16. The semiconductor structure of claim 14, wherein a magnesium content in the second hole supply layer, as compared to magnesium contents in the first hole supply layer and the third hole supply layer, has a third peak in terms of a concentration curve of magnesium.

17. The semiconductor structure of claim 14, wherein a value of the first peak of the concentration curve of aluminum is greater than a value of the second peak of the concentration curve of aluminum.

* * * * *